US008035359B2

(12) United States Patent
Chi

(10) Patent No.: US 8,035,359 B2
(45) Date of Patent: Oct. 11, 2011

(54) APPARATUS AND METHOD FOR RECOVERY OF WASTED POWER FROM DIFFERENTIAL DRIVERS

(75) Inventor: Hongwu Chi, Sunnyvale, CA (US)

(73) Assignee: Analogix Semiconductor, Inc., Santa Clara, CA (US)

( * ) Notice: Subject to any disclaimer, the term of this patent is extended or adjusted under 35 U.S.C. 154(b) by 715 days.

(21) Appl. No.: 11/820,745

(22) Filed: Jun. 19, 2007

(65) Prior Publication Data

US 2008/0278224 A1 Nov. 13, 2008

Related U.S. Application Data

(63) Continuation-in-part of application No. 11/800,861, filed on May 7, 2007.

(51) Int. Cl.
*H05F 1/00* (2006.01)
(52) U.S. Cl. ...................................................... 323/268
(58) Field of Classification Search .................. 323/220, 323/234, 268; 326/82, 83, 86, 115; 307/530; 332/103; 345/66; 455/91–129
See application file for complete search history.

(56) References Cited

U.S. PATENT DOCUMENTS

| 3,959,772 A | | 5/1976 | Wakasa et al. |
| 4,476,535 A | | 10/1984 | Loshing et al. |
| 4,964,140 A | | 10/1990 | Yonekura |
| 5,281,873 A | * | 1/1994 | Seki ................................ 327/51 |
| 5,842,140 A | * | 11/1998 | Dent et al. ..................... 455/573 |
| 5,898,297 A | * | 4/1999 | Bosnyak et al. ............... 323/315 |
| 5,907,264 A | * | 5/1999 | Feldman ....................... 332/103 |
| 5,932,123 A | | 8/1999 | Marhofer et al. |
| 6,292,901 B1 | | 9/2001 | Lys et al. |
| 6,720,745 B2 | | 4/2004 | Lys et al. |
| 6,731,132 B2 | | 5/2004 | Aloisi |
| 7,127,623 B2 | | 10/2006 | Potega |
| 7,138,992 B2 | | 11/2006 | Nakamura |
| 7,141,958 B2 | | 11/2006 | Saitoh |
| 7,142,480 B2 | | 11/2006 | Chamberlain |

(Continued)

FOREIGN PATENT DOCUMENTS

EP    1 318 601 A2    6/2003

(Continued)

OTHER PUBLICATIONS

International Search Report and Written Opinion of the International Searching Authority Dated Jun. 27, 2008, International Application No. PCT/US2007/023974.

(Continued)

*Primary Examiner* — Adolf Berhane
*Assistant Examiner* — Yemane Mehari
(74) *Attorney, Agent, or Firm* — Carr & Ferrell LLP

(57) ABSTRACT

An apparatus and method for supplying power to circuits of an integrated circuit (IC) from the wasted power in low-swing high-speed differential line drivers used in the IC, is disclosed. In a high speed line driver the load resistors of the driver are connected to a power supply, either the local power supply or the receiver power supply. DC power for the driver is supplied through these resistors. A large portion of this power, supplied from the power supply is wasted in the DC set-up circuit of the differential line driver. It is proposed to use this wasted power to power selected circuits of an IC. The use of this wasted power from the drivers for powering the circuits reduces the overall power dissipation of the system.

12 Claims, 3 Drawing Sheets

U.S. PATENT DOCUMENTS

| | | | |
|---|---|---|---|
| 7,145,541 | B2 | 12/2006 | Kurokawa et al. |
| 7,149,644 | B2 | 12/2006 | Kobayashi et al. |
| 7,154,761 | B1 | 12/2006 | Camerlo et al. |
| 7,154,981 | B2 | 12/2006 | Tokuhiro et al. |
| 7,158,003 | B2 | 1/2007 | Cern et al. |
| 7,158,563 | B2 | 1/2007 | Ginis et al. |
| 7,269,673 | B2 | 9/2007 | Kim et al. |
| 7,446,567 | B2 * | 11/2008 | Otsuka et al. ............ 326/82 |
| 7,511,515 | B2 | 3/2009 | Herbold |
| 7,583,033 | B2 | 9/2009 | Ikeda |
| 7,712,976 | B2 | 5/2010 | Aronson |
| 2003/0210074 | A1 | 11/2003 | Morgan et al. |
| 2005/0007162 | A1 * | 1/2005 | Torres ............ 327/108 |
| 2006/0005055 | A1 | 1/2006 | Potega |
| 2006/0145954 | A1 * | 7/2006 | Kubota et al. ............ 345/66 |
| 2006/0284649 | A1 | 12/2006 | Cho et al. |
| 2006/0287763 | A1 | 12/2006 | Ochi et al. |
| 2006/0291493 | A1 | 12/2006 | Schley-May et al. |
| 2006/0291575 | A1 | 12/2006 | Berkman et al. |
| 2007/0291938 | A1 | 12/2007 | Rao et al. |
| 2008/0278122 | A1 * | 11/2008 | Chi ............ 323/220 |
| 2008/0278224 | A1 * | 11/2008 | Chi ............ 327/541 |
| 2009/0189442 | A1 | 7/2009 | Chi |

FOREIGN PATENT DOCUMENTS

| | | |
|---|---|---|
| WO | WO-00/45558 | 8/2000 |

OTHER PUBLICATIONS

International Search Report and Written Opinion of the International Searching Authority Dated Jun. 27, 2008, International Application No. PCT/US2007/024015.

Adrian Freed, "Bi-directional AES/EBU Digital Audio and Remove Power", *CNMAT, UC Berkeley, Berkeley, California*, (undated), 1-6.

Tomi Engdahl, "Get power out of PC RS-232 port", *Electronics Circuits Designed by Tomi Engdahl*, (1997), 1-6.

Rod Elliott, "Balanced Line Driver & Receiver", *Elliott Sound Products, Project 51*, (1999), 1-5.

* cited by examiner

APPARATUS AND METHOD FOR RECOVERY OF WASTED POWER FROM DIFFERENTIAL DRIVERS

CROSS-REFERENCE TO RELATED APPLICATION

This application is a continuation-in-part of U.S. patent application Ser. No. 11/800,861 filed May 7, 2007.

BACKGROUND OF THE INVENTION

1. Field of the Invention

The invention generally relates to the powering of circuit blocks and devices in a system implemented as an integrated circuit, system on a chip or a chip on board using the wasted power from low swing, high speed differential driver supply.

2. Prior Art

A typical data processing and transmitting system 100 is shown in FIG. 1. The system shows a typical system on chip (SOC) implementation of data processing circuits with differential drivers, their peripheral circuits 110, and a set of associated circuit blocks 105. The associated circuits 105 include integrated circuits like memory, digital-to-analog converter (DAC), analog-to-digital converter (ADC), clock circuits, and other circuits that make up the SOC 100. It also shows a termination load circuit 120 that is either part of the SOC 100 or part of the remote receiver. The twin differential drivers NL0 and NL1 of the source transmitter 115, driving the signal lines TXN and TXP respectively, are connected through the resistors R0 and R1 to power supply (Removed receiver side) 120. The resistors are connected typically in circuit shown in the example, to the 3.3V nominal power supply. The transmitter drivers draw current from the receiver power supply, through the resistors that enable the signal swing as per the system specification. Since the drivers are differential they draw a constant DC current and consume power. Part of the power that is consumed is in the switching of the differential drivers, and the rest is used for setting up the DC conditions of the drivers with a fixed voltage and/or current. This part of the power is wasted power.

In the prior art FIG. 1 the power supply to the circuits like pre-amplifier 111, phase locked-loop (PLL) 112, data processing circuits 113, bias circuits 114, and associated circuits 105 are provided from the power connection to the SOC 100 from an external supply.

A typical driver 115 of a high speed transmission channel draws about 10.0 to 24.0 mA nominal DC current from the power supply. Typically the signal swing across the load resistors 120 is 0.4 to 0.6 V which leaves 2.7 V out of the typical 3.3V supply. This power is currently dissipated in setting up the DC conditions of the drivers and hence wasted. This power is available and can be tapped to power part of the peripheral circuits 111, 112 and 114 of the driver, data processing circuits 113 and some of the associated circuits 105 in the SOC 100 as disclosed in this disclosure.

It would be therefore advantageous to provide a circuit that reduces the amount of wasted power. It would be further advantageous if such a circuit can reduce the power consumption of the system and enable a low power implementation.

BRIEF DESCRIPTION OF THE DRAWINGS

In order to better understand the principles of the disclosed invention the following drawings are provided. It should be noted that driver power supply, typically being 3.3V, is designated in the drawings as VDD. The power supply to the peripheral circuits, data processing section and associated circuits is designated Vdd in the drawings.

DETAILED DESCRIPTION OF THE PREFERRED EMBODIMENTS

Figure 1:
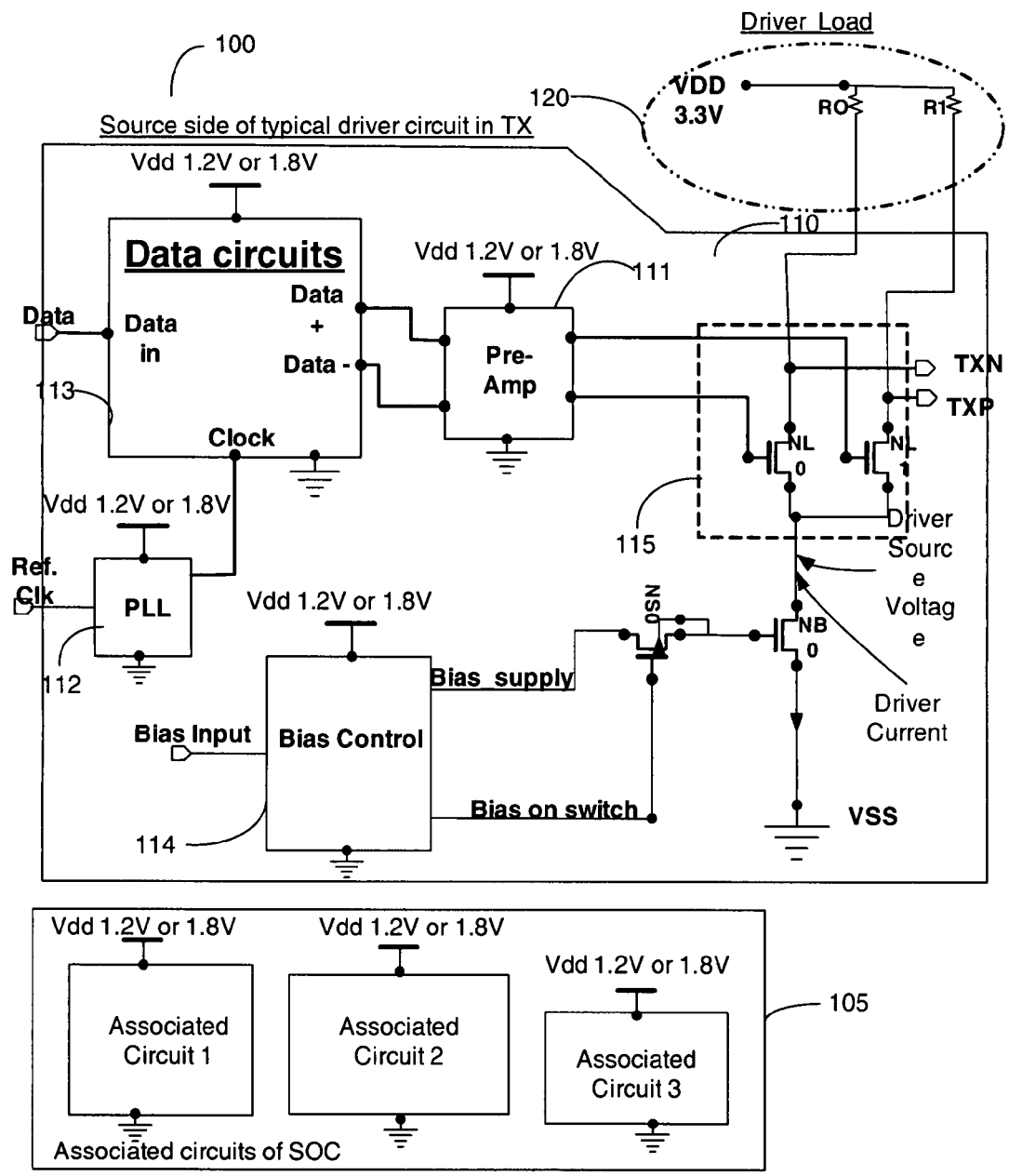
FIG. 1 is a block diagram of prior art SOC with external power supply connected to all circuits.

An apparatus and method for supplying power to integrated circuits (ICs) of a system implemented as a system on a chip, (SOC) from the wasted power in low-swing high-speed differential line drivers used in the system, is disclosed. In a high speed line driver the load resistors of the driver are connected to a power supply, either the local power supply or the remote receiver power supply. DC power for the driver is supplied through these resistors. A large portion of this power, supplied from the power supply is wasted in the DC set-up circuit of the differential line driver. It is proposed to use this wasted power to power selected circuits of the ICs in the system. The use of this wasted power from the drivers for powering the circuits reduces the overall power dissipation of the system. The disclosed apparatus and method are applicable for integrated circuit (IC), a system on chip (SOC), chip on board (COB) implementations and other system and circuit level implementations.

The following description refers to a SOC however this should not be viewed as limiting the scope of the invention in general, and in particular to the use with ICs and COBs. In a typical differential driver circuit, the load resistors of the output driver are connected to the DC power for the driver either on the SOC or, at the remote load in a receiver. The typical power supply for such a high speed driver is typically a 3.3V supply. The typical high speed driver has a limited swing of 0.4 to 0.6 V and typically 10 mA current only. In prior art implementations of circuits the rest of the voltage at the supply current that is supplied by, for example, the 3.3 V supply, is wasted in setting the DC conditions of the differential line driver. It is proposed to use this wasted power from the differential drivers to power selected peripheral circuits, such as circuits 111, 112, and 114 of the driver 115, the data processing circuits 113, and any other associated circuits 105 of the SOC, that are within the current supply capabilities. The use of this wasted power of the driver for powering the peripheral circuits reduces the total system power and enables low power circuit implementation.

Figure 2:
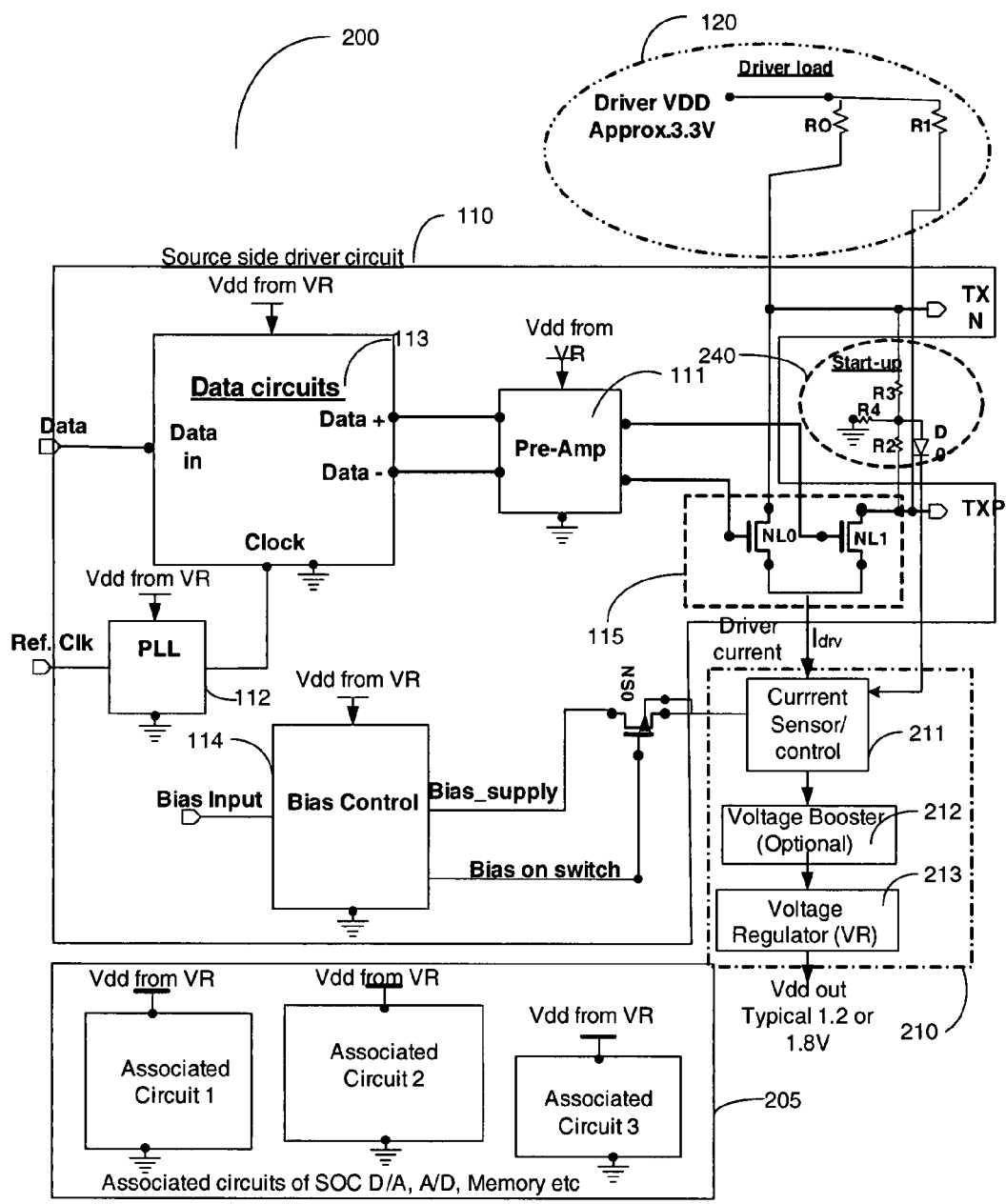
FIG. 2 is a block diagram showing an SOC with power to peripherals, data processing circuits and some associated circuits supplied in accordance with the principles of the disclosed invention from the recovered power of the drivers.

FIG. 2 is a non-limiting and exemplary SOC system 200 implemented in accordance with the principles of the disclosed invention. The output drivers have load resistors 120 comprising resistors R0 and R1 connected to the driver power supply. For the typical differential driver pair, the specified current drive is in the range of 10 mA to 24 mA per drive pair. In the case of a DC coupled Transition Minimized Differential Signaling (TMDS) link implementations, like those of HDMI or DVI transmitters, the output drive of the differential pair is 10 mA for each of four channels, or a total of 40 mA from the nominal value of the power supply, typically at 3.3V. The output swing specification for a typical high speed driver is 0.4 to 0.6V. Hence for a 0.6V swing specification, the current source of the driver has to dissipate power of 40 mA×(Vdd−0.6V). That means a minimum 1.8 Volt supply capable of driving close to 40 mA is available at the interconnected source of the differential driver transistors, NS0 and NS1. This available power can be recovered and regulated using a voltage regulator and used as a power supply for circuits of the SOC as per current availability. Accordingly the disclosed invention, by using the recovered power supplied through the load resistors, reduces the power dissipation of the total system. This recovered power supply is regulated by means of circuitry 210, designed in accordance with the principles of the disclosed invention, to enable the utilization of the wasted power, or otherwise reduce the power requirements of the SOC 200. The output of circuit 210 is used to supply power to at least some of the standard peripheral circuits 111, 112, and 114, the data processing section 113, and the associated circuits 105.

In an exemplary and non-limiting case where the required supply is greater than 1.8V, it is still possible to use the wasted power with suitable voltage enhancing circuitry like a voltage booster 212. This is an optional element and can be eliminated when it is not required. The available current as input to this supply is the DC current of the differential drivers and the available voltage is that at the interconnected source of the driver transistors NS0 and NS1 of the differential drivers.

It is necessary to use circuitry 210 with the voltage regulator 213 to regulate the voltage of the recovered power supply. Since the current through the recovered circuit is the necessary current through the differential driver circuits a current sensor and controller 211 is used to sink the required total 40 mA through this recovered power supply.

Figure 3:
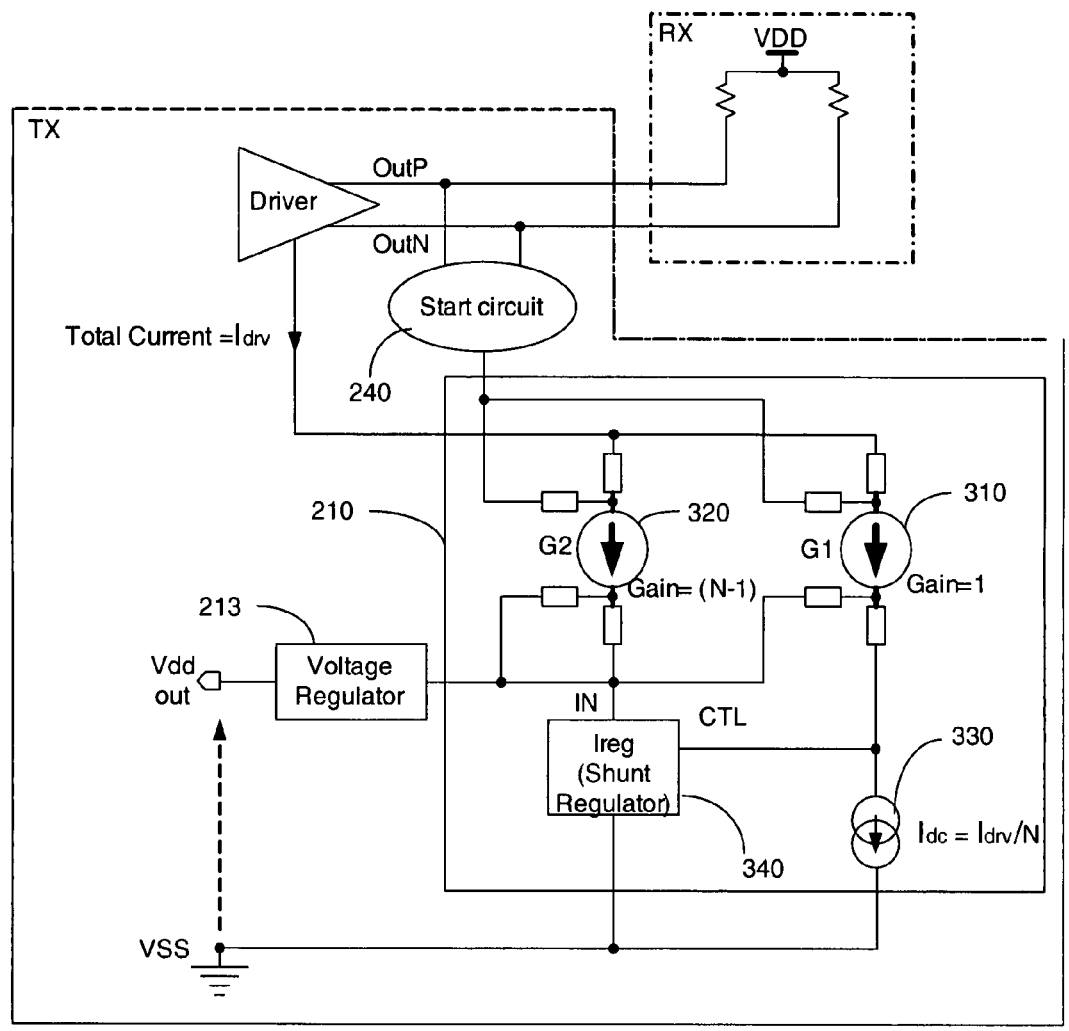
FIG. 3 is a schematic diagram showing exemplary implementation of the disclosed invention.

Reference is now made to FIG. 3 that shows of the current invention. It is necessary for the driver current of the differential driver transistor pair comprising NS1 and NS2 to be at a pre defined value, for example 10 mA per pair, to adhere with the system requirements. In order to achieve this, a biasing control circuit 211 with current sensing elements and current control is used, functioning as described herein below. Current sensing elements G1 310 and G2 320 are voltage controlled current sources with a $g_m$ proportional to 1 and N−1 providing a $g_m$ ratio of 1:N−1. Examples of G1 and G2 are MOSFET or BJT devices. It is possible to use more than two voltage controlled current sources, but at least two are necessary. The startup circuit 240 is necessary to enable the circuit to start operating when the power is supplied to the load resistors as the rest of the SOC circuits derive power from the recovered supply. This means that till the bias for the system is established the driver devices may remain in the off state. This start up circuit 240 taps or bleeds a small amount of power from the load resistor circuitry 120 as soon as connection is made to the remote termination, to generate a $V_{bias}$ voltage for G1 310 and initiate the operation of the biasing control circuit 211. The voltage controlled current source G1 310 acts as a reference current sensor and control, with a fixed current source 330 of $I_{drv}/N$ coupled to it. The voltage developed across the current source 330 is fed to the control pin, CTL of the shunt regulator 340. The shunt regulator forces the voltage at its input pin, IN, to equal that the voltage at its CTL pin by shunting the current through it. In doing so, the current passing through the shunt voltage controlled current source G2 320, will be equal to N−1 times the reference current in G1 310, which will be $(N-1)*I_{drv}/N$. Once the bias is operational, the start circuit 240 is effectively removed from the operation. This makes the total current passing through the driver to be fixed at $I_{drv}$, from both the voltage controlled current sources together, enabling the full driver current. The current through G2 320, with the voltage at the source of the device G2 320, is then available as output of the bias control circuit 211, for use as supply voltage. After regulation by the voltage regulator 213, this recovered power, voltage and current, can be used to power the chosen circuit elements of the SOC.

This voltage can also be boosted, if necessary, by the voltage booster 212, prior to regulation in the voltage regulator 213. This recovered and regulated supply voltage can then be used also by any of the circuits of the SOC that requires higher than the voltage available at the source of the shunt voltage controlled current source G2 320. Similarly lower regulated voltage can be generated using known in the art techniques.

A person skilled-in-the-art would readily appreciate that the invention disclosed herein is described with respect to specific embodiments. However, this should not be considered a limitation on the scope of the invention. Specifically, other implementations of the disclosed invention are envisioned and hence the invention should not be considered to be limited, to the specific embodiments discussed herein above. Rather, the scope of the disclosed invention is as broad as its claims and the power recovered from the differential drivers as suggested herein may be used in powering any type of IC, SOC or COB circuits.

What is claimed is:

1. A power recovery circuit for recovering wasted power supplied to a differential driver pair in a system through resistor loads connected to a system supply, comprising:
    a biasing control circuit having a current sensing and control element coupled to sources of the differential driver pair to bias the sources of the differential driver pair;
    a start up circuit coupled to the resistor loads of the differential driver pair, the start up circuit enabled to provide an initial starting bias voltage and current to the biasing control circuit when a driver power supply is enabled; and,
    a voltage regulator coupled to an output of the biasing control circuit to regulate an output supply voltage to electronic circuits;
    the power recovery circuit configured for recovering wasted power from power supplied to the differential driver pair, in the form of current and voltage available at a connected source of the differential driver pair to provide regulated power to electronic circuits.

2. The power recovery circuit of claim 1, wherein said power recovery circuit is implemented in one of: an integrated circuit (IC), a system on chip (SOC), a chip on board (COB).

3. The power recovery circuit of claim 2, wherein said electronic circuits are at least a portion of the circuits of one of an: IC, SOC, COB.

4. The power recovery circuit of claim 1, further comprising:
    a voltage booster enabled to step up an input voltage of said voltage regulator.

5. The power recovery circuit of claim 1, wherein the voltage booster is coupled between the biasing control circuit and the voltage regulator to provide a stepped up voltage to the voltage regulator.

6. The power recovery circuit of claim 1, wherein the driver load resistors are terminated to a remote power supply.

7. The power recovery circuit of claim 6, wherein said remote power supply is part of a remote receiver.

8. The power recovery circuit of claim 7, wherein said voltage controlled current sources are selected from a group of elements consisting of: MOSFET devices, BJT devices.

9. The power recovery circuit of claim 1, wherein the driver load resistors are terminated on one of said: IC, SOC, COB.

10. The power recovery circuit of claim 1, wherein the current sensing and control element is a voltage controlled current source.

11. The power recovery circuit of claim 1, wherein said start up circuit bleeds a small amount of power from the power supply to start said biasing control circuit.

12. The power recovery circuit of claim 1, wherein the said start up circuit is disabled from the biasing control circuit once the bias conditions are reached.

* * * * *